US010101407B2

(12) United States Patent
Yonan et al.

(10) Patent No.: US 10,101,407 B2
(45) Date of Patent: Oct. 16, 2018

(54) METHOD AND SYSTEM FOR DIAGNOSING BATTERY SYSTEM PROBLEMS

(71) Applicant: GM GLOBAL TECHNOLOGY OPERATIONS LLC, Detroit, MI (US)

(72) Inventors: Jakob Yonan, Sterling Heights, MI (US); Varsha Sadekar, Detroit, MI (US); Mark J. Rychlinski, Farmington Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 205 days.

(21) Appl. No.: 14/948,741

(22) Filed: Nov. 23, 2015

(65) Prior Publication Data

US 2017/0146611 A1    May 25, 2017

(51) Int. Cl.
  *G01N 27/416* (2006.01)
  *G01R 31/36* (2006.01)
  *H01M 10/42* (2006.01)
  *H01M 10/48* (2006.01)
  *H01M 10/06* (2006.01)

(52) U.S. Cl.
  CPC ..... *G01R 31/3693* (2013.01); *G01R 31/3627* (2013.01); *H01M 10/42* (2013.01); *H01M 10/06* (2013.01); *H01M 10/48* (2013.01); *H01M 2220/20* (2013.01); *Y02E 60/126* (2013.01)

(58) Field of Classification Search
  CPC .................................................. G01R 31/3658
  USPC ......................................................... 324/426
  See application file for complete search history.

(56) References Cited

U.S. PATENT DOCUMENTS

| | | | | |
|---|---|---|---|---|
| 2005/0134282 | A1* | 6/2005 | Averbuch ........... | G01R 31/3651 324/426 |
| 2009/0265125 | A1* | 10/2009 | Zhang ................. | H01M 10/482 702/63 |
| 2010/0175656 | A1* | 7/2010 | Doub ..................... | F02N 11/10 123/179.3 |
| 2010/0181959 | A1* | 7/2010 | Gibbs ................. | F02N 11/0866 320/104 |

* cited by examiner

*Primary Examiner* — Edward Tso
*Assistant Examiner* — Ahmed Omar
(74) *Attorney, Agent, or Firm* — Reising Ethington, P.C.

(57) ABSTRACT

A method and system for diagnosing battery system problems in a vehicle, where the method distinguishes between problems of various battery system components. More particularly, battery connection problems such as loose connections, corroded battery terminals, etc., may be distinguished from battery system problems as a whole. Load related readings that generally reflect the performance of the battery system during a cranking event and one or more non-load related readings may be gathered and used to determine whether there is a battery system problem and whether there is a battery specific problem. If load related readings and/or non-load related readings fail to indicate a battery specific problem, a battery connection problem may be diagnosed.

17 Claims, 6 Drawing Sheets

METHOD AND SYSTEM FOR DIAGNOSING BATTERY SYSTEM PROBLEMS

FIELD

The present invention relates generally to vehicle battery systems, and more particularly, to determining and/or distinguishing between various types of battery system problems.

BACKGROUND

Vehicle health management systems typically diagnose and alert the driver as to potential problems with various vehicle systems, including vehicle battery systems. Typically, if there is a problem with a component of the vehicle battery system, such as a battery specific problem or a problem with one or more battery connections, a general diagnosis is made with regard to the health of the vehicle battery system as a whole. By distinguishing between problems for the various battery system components, it may be possible to avoid extra diagnostic effort to ascertain the problem and decrease expenses accordingly. For example, if a battery connection problem can be distinguished from a battery system problem as a whole, a driver may be able to quickly and/or easily remedy the battery connection problem without incurring significant effort or expense.

SUMMARY

According to one embodiment, there is provided a method for diagnosing a battery system problem in a vehicle. The method comprises the steps of gathering one or more load related readings and one or more non-load related readings. The load related readings reflect performance of the battery system during a cranking event. At least one load related reading, at least one non-load related reading, or a combination of one or more load related readings and non-load related readings are used to determine if there is a battery system problem. When it is determined that there is a battery system problem, then the method includes the step of determining if there is a battery specific problem. When it is determined that there is a battery system problem and no battery specific problem, then a battery connection problem is diagnosed.

According to another embodiment, there is provided a method for diagnosing a battery system problem in a vehicle. The method comprises the step of gathering one or more load related readings and one or more non-load related readings. The method further involves using one or more load related readings, one or more non-load related readings, or a combination of one or more load related readings and one or more non-load related readings to determine if an errant cranking event occurred. If it is determined that an errant cranking event occurred, then the method involves evaluating one or more load related readings, one or more non-load related readings, or a combination of one or more load related readings and non-load related readings to determine if there is a battery connection problem.

According to another embodiment, there is provided a battery system for a vehicle. The battery system includes a battery, one or more battery connections, one or more battery sensors electrically connected to the battery via at least one of the battery connections, and a control module. The control module is configured to gather one or more load related readings that reflect performance of the battery system during a cranking event and one or more non-load related readings from the one or more battery sensors, use the one or more load related readings to diagnose a battery system problem and a battery specific problem, and diagnose a battery connection problem if there is a battery system problem diagnosis and not a battery specific problem diagnosis.

DRAWINGS

Preferred exemplary embodiments will hereinafter be described in conjunction with the appended drawings, wherein like designations denote like elements, and wherein.

DESCRIPTION

The method and system described herein may be used to more accurately or precisely diagnose battery system problems. The battery system generally includes a battery and one or more battery connections that facilitate the transmission of current to various electrical components in a vehicle. The method and system described herein may be used to alert or otherwise inform a driver that there may be a problem with one or more battery connections, as opposed to merely indicating that there is a problem somewhere in the battery system overall. This allows for a more robust vehicle health management system, as problems with one or more battery connections may be distinguished from problems relating more specifically to the vehicle battery itself. In one embodiment, the system and method uses one or more load related readings to diagnose a problem with the battery system overall. Load related readings may reflect performance of the battery system during a cranking event. Then, if the load related readings and/or one or more non-load related readings fail to indicate that the problem is specific to the battery itself, then the system and method may assume that the problem is with one or more battery connections.

For purposes of illustration and clarity, the following description is generally directed to an embodiment of a battery system where the battery is a standard 12-48V battery, or an SLI (starting-lights-ignition) battery. The battery may be of any type, such as lead acid, lithium ion, ultra-capacitor, etc. It should be appreciated, however, that the present method and system are not meant to be so limited, as they may also be used to diagnose problems in battery systems having different types of batteries, different voltage levels, or different battery system components. Accordingly, those embodiments relating to diagnosing battery system problems other than those relating to a typical SLI battery remain within the spirit and scope of the present disclosure.

In one embodiment, if the battery involved is a 12-48V lead acid type SLI battery, certain battery system problems may arise. For example, problems attributable to a battery system as a whole may include long crank times or no crank events, low state of charge (SOC), diminished performance of electrical devices (e.g., clock resetting, lights dimming, etc.), to cite a few possibilities. The method and system described herein can help to distinguish more particular battery connection problems from battery system problems as a whole. One way in which to accomplish this can include evaluating one or more load related readings and/or one or more non-load related readings to determine whether the battery system problem is a battery specific one. If the battery system problem is not battery specific, the method and system will diagnose the battery system problem as a battery connection problem. Loose battery connections may result from debris, dirt, or corrosion at the battery cable/terminal junction either from corrosion of the cable or corrosion of the terminal, for example. In another example, a loose battery connection may be present where the ground cable is connected to the motor and/or body frame. Battery connection problems may also result from fraying or physical damage such as terminal breakage. Other types of battery connection problems are certainly possible.

Typically, with a battery connection problem, load related readings such as crank resistance will indicate a battery connection problem. Further, increased crank resistance as well as increased battery resistance, can indicate a loose or otherwise faulty battery connection. If other load related readings or non-load related readings are normal, such as crank time, open circuit voltage, or state of charge, etc., a battery connection problem may be diagnosed, distinguishing it from a battery system problem in general. By diagnosing the more particular battery connection problem, a driver or user of the vehicle may be able to avoid unnecessary maintenance costs, battery replacements, warranty costs, etc. Accordingly, the predictive functionality of a vehicle health management system may be improved.

Figure 1:
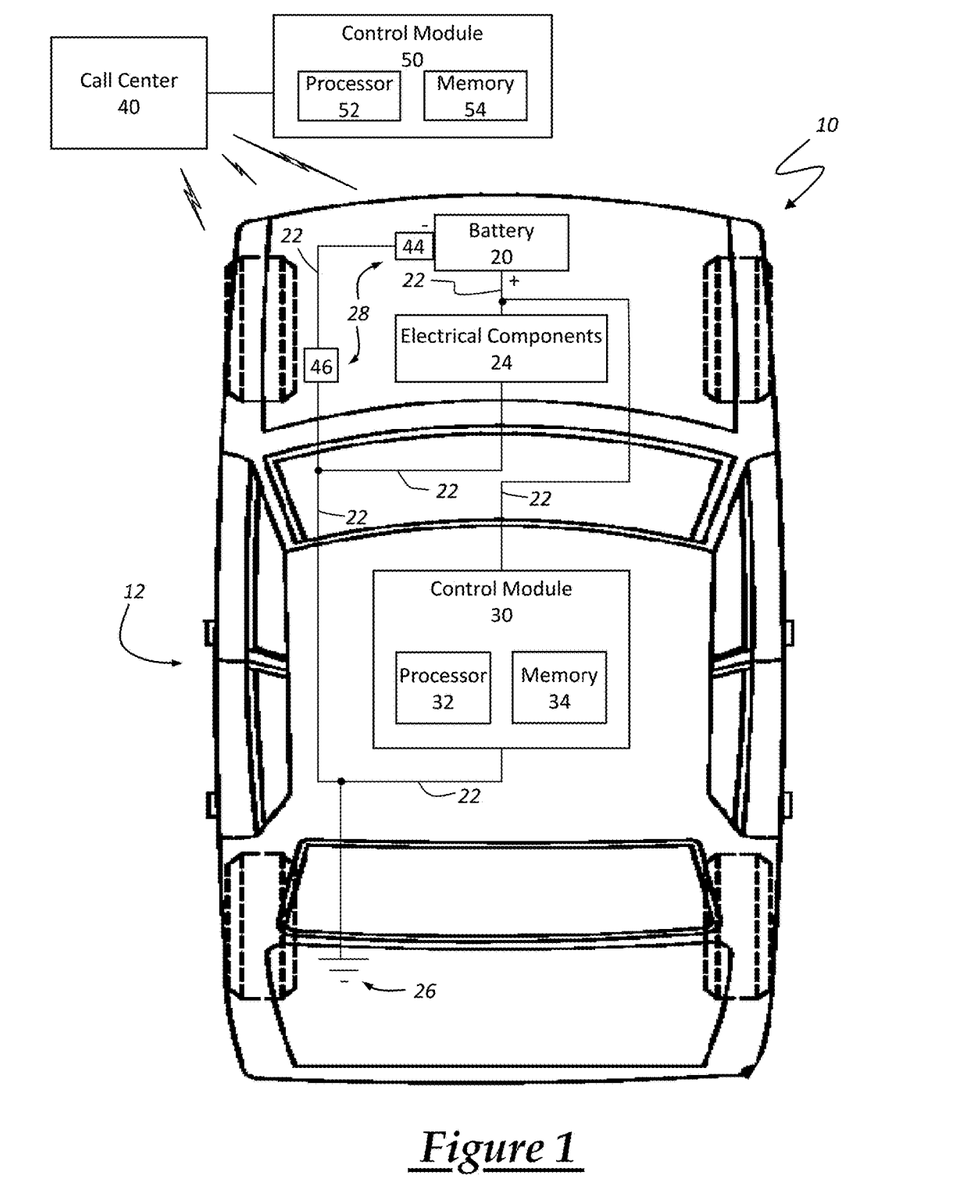
FIG. 1 is a schematic diagram of a vehicle having a battery system in accordance with one embodiment.

With reference to FIG. 1, some of the components of an exemplary vehicle 10 are shown, with which the present method and system may be used. Vehicle 10 includes a typical internal combustion engine (not shown), and although the following description is provided in the context of the particular vehicle 10 illustrated in FIG. 1, it will be appreciated that this vehicle is merely exemplary and that other vehicles may certainly be used instead. For example, the method and system described herein may be used with any type of vehicle having a battery, including a hybrid electric vehicle (HEV) or an electrical vehicle (EV), to cite a few possibilities. In one embodiment, vehicle 10 generally includes a vehicle battery system 12. Vehicle battery system 12 may include a battery 20, battery connections 22, electrical components 24, a ground 26, one or more battery sensors 28, and a control module 30. In another embodiment, the battery system 12 includes more than one battery or a dual battery system.

Battery 20 may be a source for electrical energy that is used to meet certain electrical needs of the vehicle. As described above, in this embodiment, battery 20 is a lead acid battery, which may be a LN2 type battery, an LN5 type battery, an AGM battery, a flooded type battery, etc. However, battery 20 may utilize any suitable battery chemistry, such as lithium ion, ultra-capacitor, or some other battery technology, for example. As mentioned previously, there may be more than one battery, or in one embodiment, there may be a dual battery system. In this particular example, the battery 20 may help power one or more ignition system components such as a starter motor, electrical devices such as lights or control modules, infotainment devices, etc. The battery may consist of a number of individual battery cells, or the battery system may include a plurality of batteries, instead of merely including the single battery 20 as shown in FIG. 1. Those skilled in the art will appreciate that vehicle batteries may be provided according to any number of different embodiments, may be connected in any number of different configurations, and may include any number of different sub-components, like sensors, control units, and/or other suitable components known in the art.

Battery connections 22 facilitate the transfer of current to the various components of battery system 12. Battery connections 22 include cables, wires, terminals, couplings, etc. to help facilitate connections between the various circuit components including battery 20, electrical components 24, one or more battery sensors 28, invertors/convertors, alternators, motors, or other devices for providing additional charge to battery 20, as well as any other operable circuit component. The battery connection couplings may include crimped and/or soldered terminals, lugs, etc. for connecting cables to the respective terminals of battery 20. Battery connections 22 may include a ground 26, which can be connected to the motor and/or the body frame of vehicle 10, to cite a few examples. Battery system devices such as the battery 20 and electrical components 24 may be connected via one or more battery connections 22 in series, parallel, or a combination of both depending on the desired arrangement and needs of the battery system 12.

Electrical components 24 may include any device or system in need of electrical power. As mentioned above, in the embodiment illustrated in FIG. 1, battery 20 is a standard 12-48V lead-acid battery that may be used to provide power to numerous electrical components 24 of vehicle 10, including but not limited to ignition system devices, lights, fans, etc. In another example, the battery may be a high voltage battery, where its power is used to provide motive force to the vehicle.

Battery sensors 28 may include any variety of different sensing components or elements, and may monitor a variety of battery-related parameters or conditions such as voltage, current, SOC, state-of-health (SOH), state of function, temperature of the battery pack, etc., to provide load related readings and/or one or more non-load related readings that may be used by the battery system 12. Battery sensors 28 may include sensors that are integrated within the battery system 12 or battery 20 (e.g., an intelligent or smart battery), are externally located outside the battery system 12 or battery 20, or are provided according to some other known arrangement. In an exemplary embodiment, battery sensors 28 include one or more voltage sensors for sensing the overall voltage across the battery pack 24, a current sensor for sensing charge or discharge current flow through the battery 20, one or more temperature sensors for sensing or detecting the temperature of the battery 20, and any number of other sensors known in the art. In a preferred embodiment, battery sensors 28 include a voltage event counter that resets in instances where the voltage drops below a threshold level. For example, the voltage event counter may add a "count" during each successful cranking event, and drop to zero upon an errant cranking event, where the voltage drops below a threshold level, for example. Successful cranking events may be defined by the terminal to terminal voltage during a cracking event that is above a voltage threshold (e.g., 4.5V for a 12V battery). The voltage event counter may be integrated with or otherwise a part of another vehicle component or device, such as control module 30. In one embodiment, the battery system 12 includes two battery sensors 28: an intelligent battery sensor 44 coupled with the negative terminal of battery 20 and a Hall Effect current sensor 46. However, it should be understood that battery sensors 28 may include only one sensor, or more than two sensors, depending upon the desired implementation. Battery sensors 28 may be electrically connected (e.g., by a wired connection or wirelessly) to and configured for communication with control module 30, a more specific battery control module or another specific control module, and/or to any other suitable device.

Control module 30 may be used to control, govern, or otherwise manage certain operations or functions of vehicle 10 and/or one or more components or modules thereof (e.g., battery system 12). In an exemplary embodiment, control module 30 is a battery control module and includes a processor 32 and memory 34. Processor 32 may include any type of suitable electronic processor (e.g., a microprocessor, a microcontroller, an application specific integrated circuit (ASIC), etc.) that executes instructions for software, firmware, programs, algorithms, scripts, etc. This processor is not limited to any one type of component or device. Memory 34 may include any type of suitable electronic memory means and may store a variety of data and information. This includes, for example: sensed values or parameters for various load related readings; sensed values or parameters for various non-load related readings; look-up tables and other data structures; software, firmware, programs, algorithms, scripts, and other electronic instructions; component characteristics and background information, etc. The present method—as well as any other electronic instructions and/or information needed for such tasks—may also be stored or otherwise maintained in memory 34 such that control module 30 may be configured to perform one or more steps of the method described in greater detail below. In another preferred embodiment, the present method—as well as any other electronic instructions and/or information needed for such tasks—may be stored remotely, such as at call center 40, which allows for updates to only be done at a centralized location instead of updating or reflashing each vehicle. Accordingly, the call center may include its own control module 50 having a processor 52 and memory 54 for executing one or more aspects of the various methods described herein. Control module 30 may be electronically connected to other vehicle devices and modules via I/O devices and suitable connections, like a communications bus, so that they can interact as required. Further, the control module 30 need not be electrically connected within the battery system as shown in FIG. 1. These are, of course, only some of the possible arrangements, functions, and capabilities of control module 30, as others are certainly possible. Depending on the particular embodiment, control module 30 may be a stand-alone electronic module (e.g., a battery control module), it may be incorporated or included within another electronic module in the vehicle (e.g., an engine control module, a hybrid control module, a body control module, etc.), or it may be part of a larger network or system (e.g., a battery management system (BMS), a vehicle energy management system, etc.), to name a few possibilities.

Battery system 12 may include fewer components, more components, or other components than what is illustrated in FIG. 1. For example, as addressed above, the battery system may include one or more components for charging the battery, such as a motor, a generator, an alternator, etc., or any other operable circuit component. Further, those skilled in the art will appreciate that vehicle batteries may be provided according to any number of different embodiments, may be connected in any number of different configurations, and may include any number of different sub-components, like sensors, control units, and/or any other suitable components known in the art. Again, the preceding description of the exemplary vehicle 10 and the drawing in FIG. 1 are only intended to illustrate one potential vehicle arrangement and to do so in a general way. Any number of other vehicle arrangements and architectures, including those that differ significantly from the one shown in FIG. 1, may be used instead.

Figure 2:
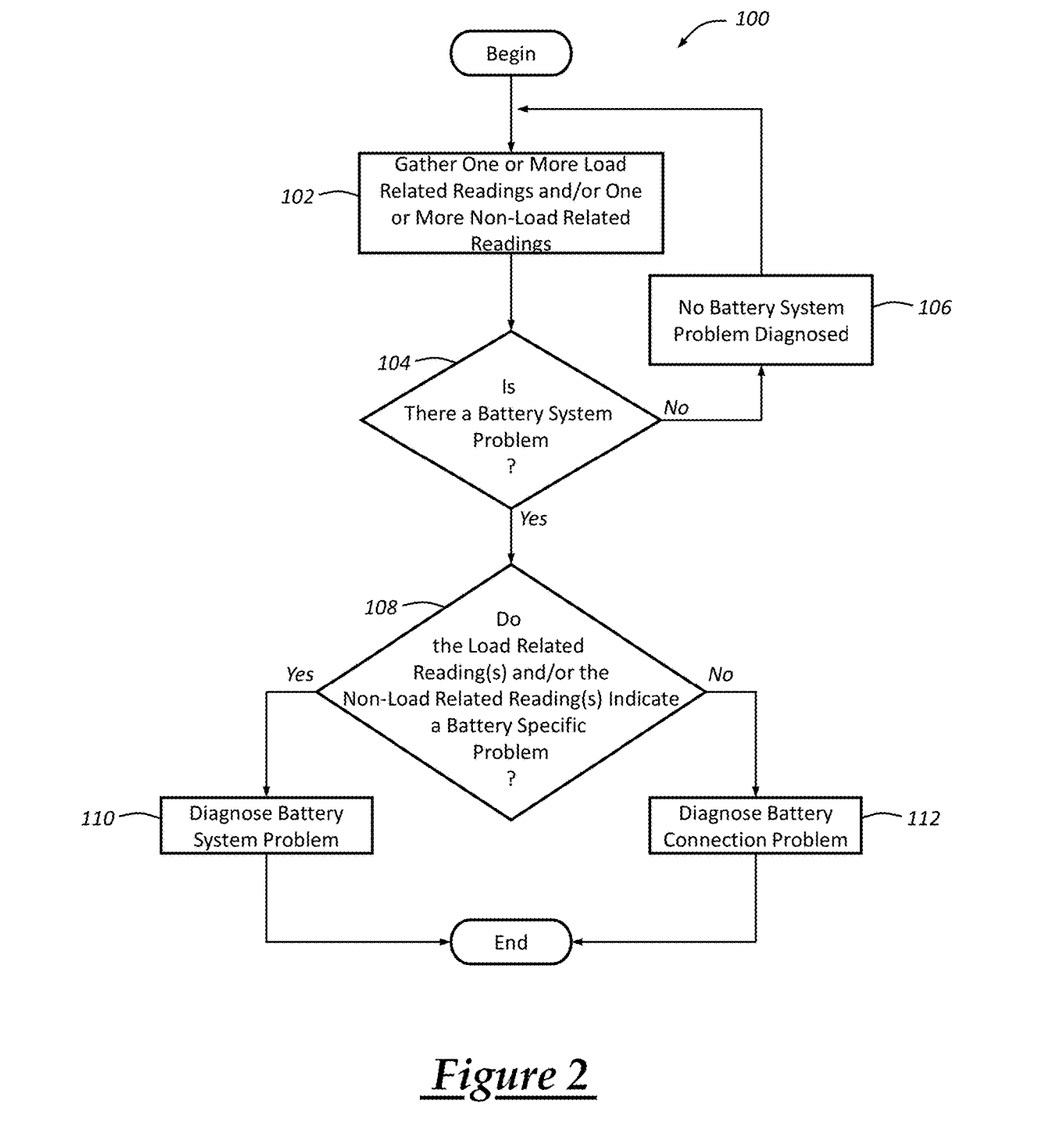
FIG. 2 is a flowchart showing an example of a method for diagnosing battery system problems that may be used with a vehicle battery system, such as the system illustrated in FIG. 1.

Turning to FIG. 2, there is shown an exemplary method 100 for diagnosing battery system problems, such as, for example and without limitation, a problem with a battery or battery connections of a battery system (e.g., battery 20 and/or battery connections 22 of battery system 12 described above). It will be appreciated that while the description below is primarily directed to the use of the present method to diagnose problems in a battery system that incorporates a standard 12V lead acid type battery, the present disclosure is not meant to be so limited. Rather, those of ordinary skill in the art will appreciate that the present method may be used to diagnose battery system problems where a different battery type, or more than one battery, is used. Accordingly, the present disclosure is not limited to any one particular type of battery.

In one particular example, the method 100 may be executed and/or initiated following a starting, ignition, or cranking event. And in one embodiment, the method may be executed about five minutes after a cranking event while in the drive cycle, such that the method has sufficient load related readings and/or non-load related readings as input. In another embodiment, the method 100 is operable continuously. However, it should be understood that the method may be executed and/or initiated at any suitable time depending upon the desired implementation. Further, as will be appreciated by those skilled in the art, terms such as "crank," "cranking," "starting," and "ignition" may be used interchangeably herein.

Step 102 of the method 100 gathers one or more load related readings and/or one or more non-load related readings. In one embodiment, one or more load related readings and/or one or more non-load related readings are sampled. As described in further detail below, load related readings generally pertain to battery system qualities when a cranking load is applied. The load related readings and/or non-load related readings, in one embodiment, may be obtained or otherwise derived from the output of battery sensors 28. For example, an intelligent battery sensor may provide readings and/or information relating to the charge or discharge current flowing through the battery, the voltage across the battery terminals, and/or battery temperature, which may be used to provide input for state of charge (SOC) or state of health (SOH) calculations. The load related readings and/or non-load related readings may also be obtained from a control module, such as an engine control module, a body control module, a battery control module such as control module 30, or another device or module. Load related readings and/or non-load related readings may also relate to standardized battery qualities known upon installation, such as the internal resistance of the battery. Other sources and computational derivatives that may be used to provide load related readings and/or non-load related readings will be apparent to one having ordinary skill in the art.

Load related readings generally include any battery system related parameter that relates to the cranking history of the battery 20. In one embodiment, load related readings reflect performance of the battery system 12 during a cranking event. In a preferred embodiment, the load related readings relate to both errant cranking events (e.g., long crank times, no crank, etc.) and normal cranking events. One load related reading that may be gathered in step 102 and used with method 100 is cranking resistance. Cranking resistance generally refers to the amount of resistance when a load is applied to the battery. The cranking resistance may be a measured resistance value (e.g., in Ohms or mOhms), a calculated resistance value derived from other measurements (e.g., cranking resistance is proportional to the current and voltage during a cranking event), or a resistance ratio, to cite a few examples. For vehicles that do not include an intelligent battery sensor, a maximum current reading or measurement may not be available, and as such, it is possible to estimate the resistance of the battery based on other parameters, for example, through the dynamic resistance (dV/dI) during cranking. Skilled artisans will appreciate that the resistance is dependent on the size and type of battery, and the resistance may be a calibratable value based on testing. In one particular embodiment, the cranking resistance may be provided as a crank resistance value (CRV) that estimates the ratio of the resistance between the battery and starter (Rb/Rs), and may be provided in accordance with the following equation:

$$CRV = (\text{Open Circuit Voltage}/\text{Minimum Voltage During Crank Event}) - 1 \qquad \text{Eq. 1}$$

Load related readings may also include the cranking voltage of the battery. The cranking voltage generally represents the voltage difference between a positive terminal and a negative terminal of the battery during a cranking event, and it relates to the cranking history of the battery in that, when the voltage drops below a certain threshold (e.g., less than 5.5V, or more particularly, less than 4.5V for a 12V battery when a load is applied, such as during a cranking event), it may be indicative of a history of one or more errant cranking events. In one embodiment, the cranking voltage may be provided through a counter, such as a voltage event counter. The voltage event counter may be provided through a proportional-integral-derivative controller (PID controller) that may be part of a control module such as control module 30, a body control module (BCM), or an engine control module (ECM). The voltage event counter may increment if a minimum voltage during cranking is greater than a threshold voltage value (e.g., 5.5V or 4.5V for a 12V battery). If a minimum voltage during cranking is below a threshold voltage value, then the voltage event counter may reset. In other words, the voltage event counter may provide a count of successful cranking events, where successful cranking events are defined by a voltage difference between a positive terminal and a negative terminal of the battery during a cranking event that is above a voltage threshold. As described in further detail below, in some embodiments, the cranking resistance and/or one or more counter resets may be used to determine if there is a battery system problem or a battery specific problem.

The load related readings may further include crank time (e.g., in seconds). If the crank time was greater than a certain threshold (for example, greater than 0.8 seconds), there may be a battery system problem or a battery specific problem. Longer crank times are generally indicative of an errant cranking event.

Non-load related readings generally include any battery system related parameter that that relates to qualities that are usually specific to the battery itself. It should be understood that non-load related readings may not be entirely mutually exclusive of load related readings, and vice versa. For example, certain non-load related readings may be indirectly indicative of the cranking history of the battery, yet may also relate to battery specific qualities. The examples for load related readings and non-load related readings provided herein may be used as a framework for discerning between some non-load related readings and load related readings, but it should be understood that the provided examples are meant to be non-limiting, as the system and method may incorporate different combinations load related readings and/or non-load related readings than what is explicitly described.

Non-load related readings may include the battery resistance (e.g., the internal resistance as opposed to the cranking resistance, such as the internal resistance of the battery to accepting charge), the battery current, the battery voltage including the open circuit voltage (OCV) and/or the voltage across the battery terminals when the battery is being charged or discharged during use of the vehicle (e.g., typical battery use while the vehicle is in operation as opposed to the more particular cranking voltage), the SOC, as well as the battery temperature. In some embodiments, the OCV is preferred over the battery voltage under load, as it can provide a more reliable indication of the battery voltage. The OCV is the voltage across the battery terminals when no external load is connected, or when no current is flowing between the terminals.

As with the cranking resistance, the battery resistance may be a measured resistance value (e.g., in Ohms or mOhms), a calculated resistance value derived from other measurements, or a resistance ratio, to cite a few examples. For vehicles that do not include an intelligent battery sensor, a maximum current reading or measurement may not be available, and as such, it is possible to estimate the resistance of the battery based on other parameters, for example, through the dynamic resistance (dV/dI). Skilled artisans will appreciate that the resistance is dependent on the size and type of battery, and the resistance may be a calibratable value based on testing. In one particular embodiment, the battery resistance may be provided through the following equation, where a charge resistance value (ChRV) is representative of the battery resistance, battery voltage and battery current are load-based measurements or values, OCV is a non-load-based measurement or value, and k is a coefficient factor that includes the maximum battery capacity and charge rate:

$$ChRV = (((\text{battery voltage} - OCV)/\text{battery current})*k) \qquad \text{Eq. 2}$$

Once one or more load related readings and/or one or more non-load related readings are gathered in step 102, step 104 determines if there is a battery system problem. In one embodiment, an errant cranking event may be determinative of a battery system problem. In a more particular embodiment, one or more load related readings may be used to determine if there is a battery history problem. For example, high cranking resistance may indicate a battery system problem. In one embodiment, if the cranking resistance is greater than 10 mOhm, or a cranking resistance ratio such as that calculated using Equation 1, is greater than 0.6, it may be determinative of a battery system problem. The typical resistance in a normal 12V lead acid battery is about 5 mOhm. Any one load related reading, or a non-load reading, or a combination of load related readings and/or non-load related readings may be used to determine whether there is a battery system problem. In a preferred embodiment, cranking voltage, cranking resistance, and battery resistance are used to determine whether there is a battery system problem. For example, if a voltage counter resets, the cranking resistance is above a threshold resistance value, and the battery resistance is above a threshold resistance value (e.g., similar to or the same as the cranking resistance threshold values provided above), it may be determined that there is a battery system problem. In another embodiment, if a voltage counter resets, it may be determined that there is a battery system problem. In yet another embodiment, factors other than load related readings or non-load related readings may be used to determine whether there is a battery system problem. Other embodiments are certainly possible. If there is no battery system problem, the method continues to step 106, where no battery system problem is diagnosed, and the method loops back to the beginning. If there is a battery system problem, the method moves to step 108.

Step 108 asks whether the one or more load related readings and/or one or more non-load related readings indicate a battery specific problem. If the battery system problem is specific to the battery itself, then the problem is most likely not a battery connection problem. In the alternative, if the battery system problem is not specific to the battery itself, then the problem is most likely a battery connection problem. Through a sort of root cause analysis, the method 100 can indicate a more particular battery connection problem as opposed to merely diagnosing a battery system problem as a whole. This can result in less costs involved to fix and/or diagnose the battery system issue, and can provide a more accurate determination of vehicle health status.

The method may make use of the fact that crank and battery resistance will increase with a battery connection problem, such as one or more loose battery connections. By looking at one or more load related readings and/or non-load related readings, the method may be able to determine that the problem is likely a battery connection problem. For example, if a vehicle exhibits a high crank and battery resistance (e.g., greater than 10 mOhm in normal conditions) with a relatively normal crank time (e.g., less than 0.8 seconds for a 12V battery), relatively normal OCV (e.g., above 12.4V for a 12V battery), and relatively normal SOC (e.g., above 60%), then step 108 may determine that the battery system problem is not a battery specific problem, and thereby diagnose a battery connection problem (step 112). Historical data or information such as crank time and OCV may be provided or supplemented through a buffer, for example, a buffer of about 40 cycles in one embodiment. In another embodiment, if the vehicle does not satisfy an acceptable threshold for more than two non-load related readings (e.g., low SOC, low OCV, etc.), then step 108 may determine that there is likely a battery specific problem, and diagnose a battery system problem. In yet another embodiment, if there is high crank and battery resistance, if the battery temperature is greater than a threshold (e.g., −15° C.), if the OCV is greater than a threshold (e.g., 12.4V), if the SOC is greater than a threshold (e.g., 60%), and if the crank time is greater than a threshold (e.g., 0.8 seconds), then a battery connection problem may be diagnosed. It should be understood that if there is a battery connection problem and a battery specific problem, that the method will likely diagnose a battery system problem. Any weighting and/or operable combination of pieces of load related readings and/or non-load related readings may be used to indicate a potential battery specific problem in step 108. Moreover, the thresholds may be customized depending on the size and type of battery used in the battery system.

Figure 3:
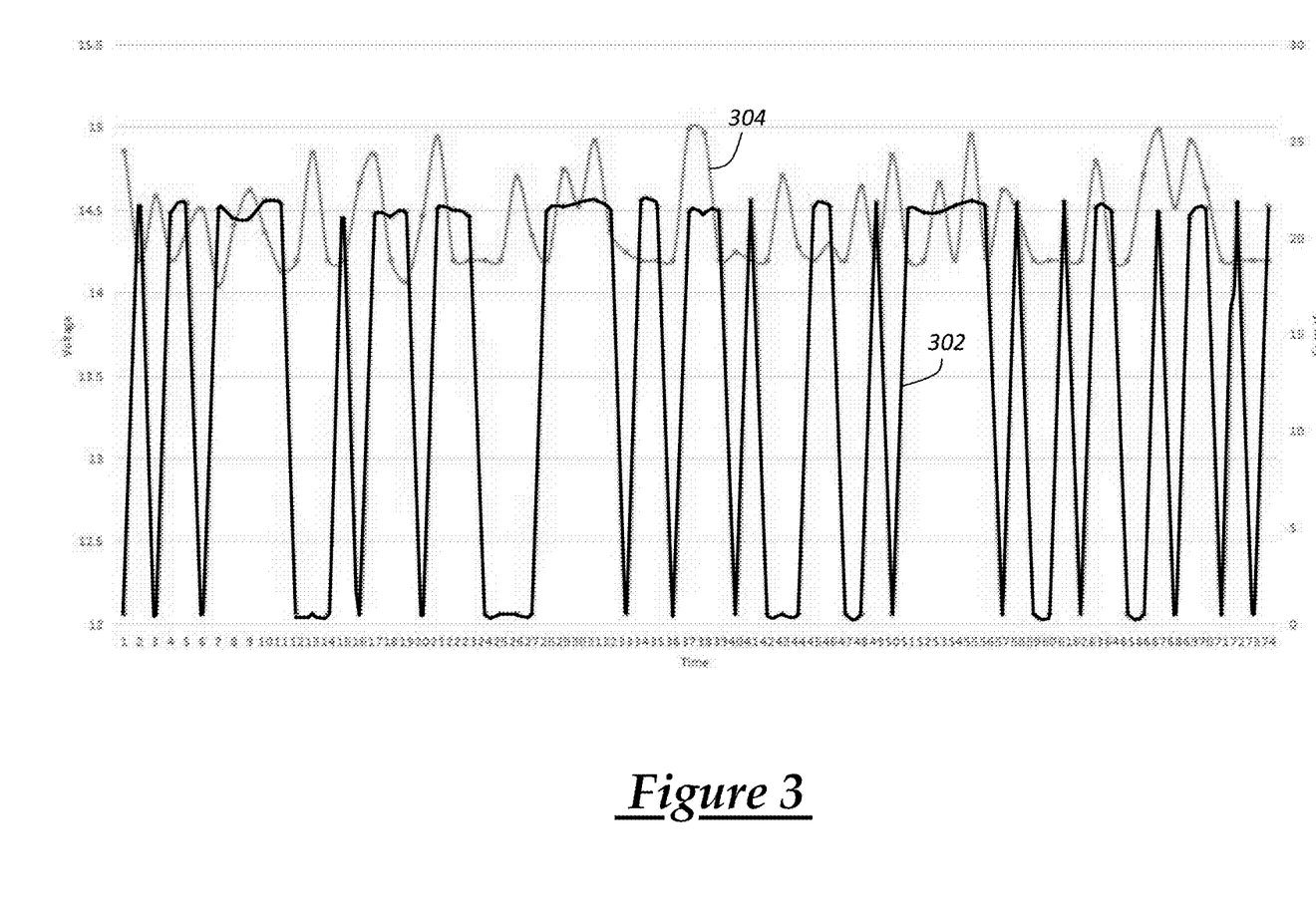
FIGS. 3-6 show example load related readings and/or non-load related readings that may be used with a method or system for diagnosing battery problems, such as the method illustrated in FIG. 2.

FIGS. 3-6 provide some examples of load related readings and non-load related readings that may be used with a method or system for diagnosing battery problems, such as the method 100. FIG. 3 illustrates an output of an intelligent battery sensor, which in this embodiment, takes readings or measurements 100 times per second. FIG. 3 shows an oscillating current 302 in the presence of a relatively consistent voltage 304, which may be used to help determine that there is a battery connection problem, or that there is not a battery specific problem. In one embodiment, the pattern depicted in FIG. 3 may be used as a way to reduce false positives (e.g., verification that the load related readings are indicative of a battery connection problem). For this particular example, where the battery system includes a 12V battery, the voltage ranges between approximately 14V and 15V, indicating relatively normal performance. The current, however, oscillates between a low to high current magnitude greater than about 20 Amps. This oscillation in the current with relatively normal voltage levels may be used to verify that there is a battery connection problem.

Figure 4:
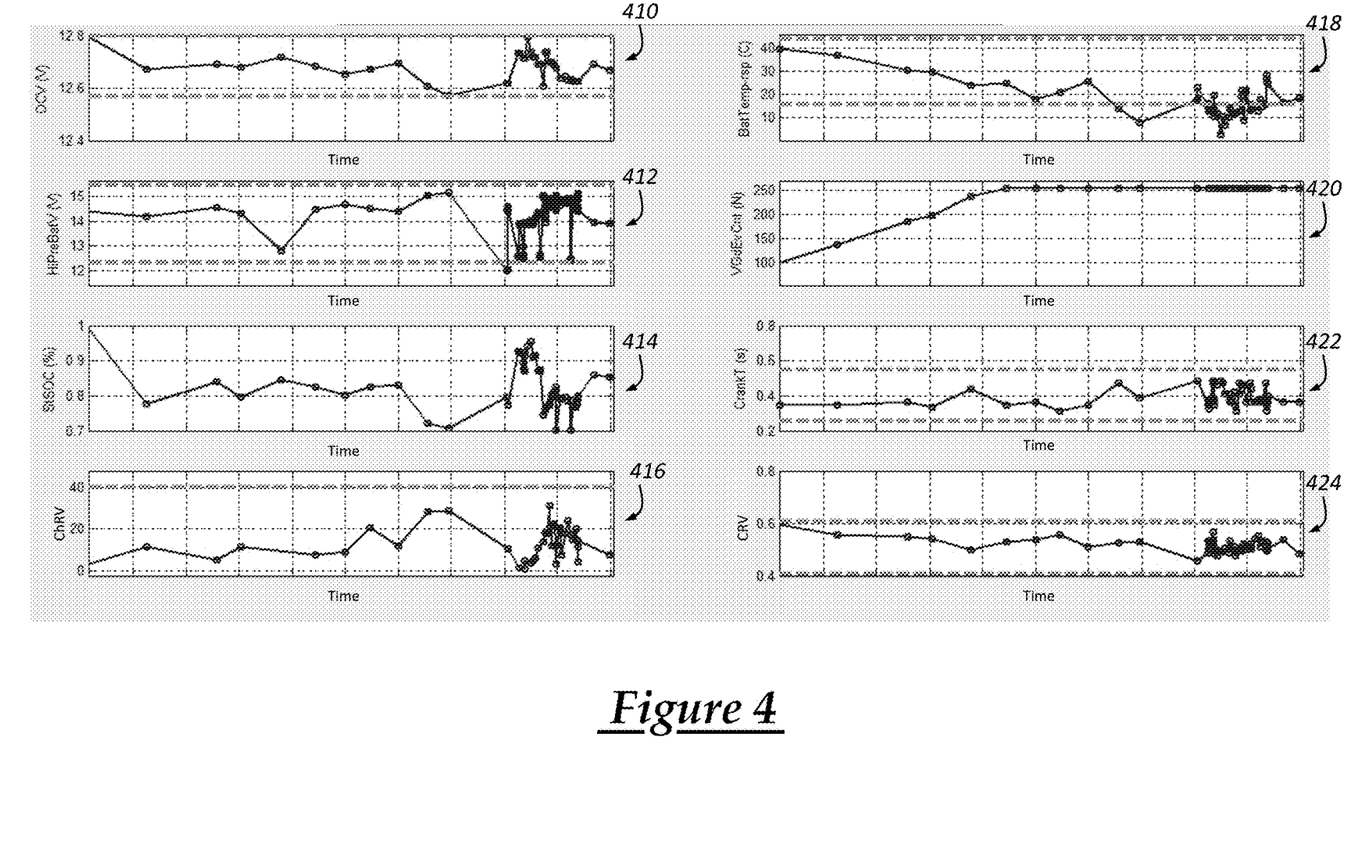

FIG. 4 illustrates example parameters that may be indicative of a good battery. The x-axis in this example represents a time period of about 100 days. Non-load related readings include OCV 410; the voltage across the battery terminals, or the high precision battery voltage (HiPreBatV) 412; the SOC 414; the battery resistance, or in this example the charging resistance value (ChRV) as provided in Equation 2 above, 416; and the battery temperature 418. Load related readings include cranking voltage, or in this example, a voltage event counter (VGdEvCnt) 420; crank time 422; and crank resistance, or in this example the crank resistance value (CRV) as provided in Equation 1 above, 424. Example thresholds are designated with thick dashed horizontal lines. The battery temperature may be used in some embodiments to determine or otherwise verify whether other data is accurate. For example, skilled artisans will appreciate that the resistance of the battery increases as the temperature decreases. Accordingly, it may be desirable in some instances to wait until the temperature reaches a predetermined threshold level before diagnosing a battery system problem. In the example in FIG. 4, the load related readings 420, 422, 424 fail to indicate a potential battery system problem. Moreover, the non-load related readings 410, 412, 414, 416, and 418 also fail to indicate a potential battery system problem, as their respective values fall within the exemplary thresholds. Accordingly, in this example, no battery system problem would be diagnosed.

Figure 5:
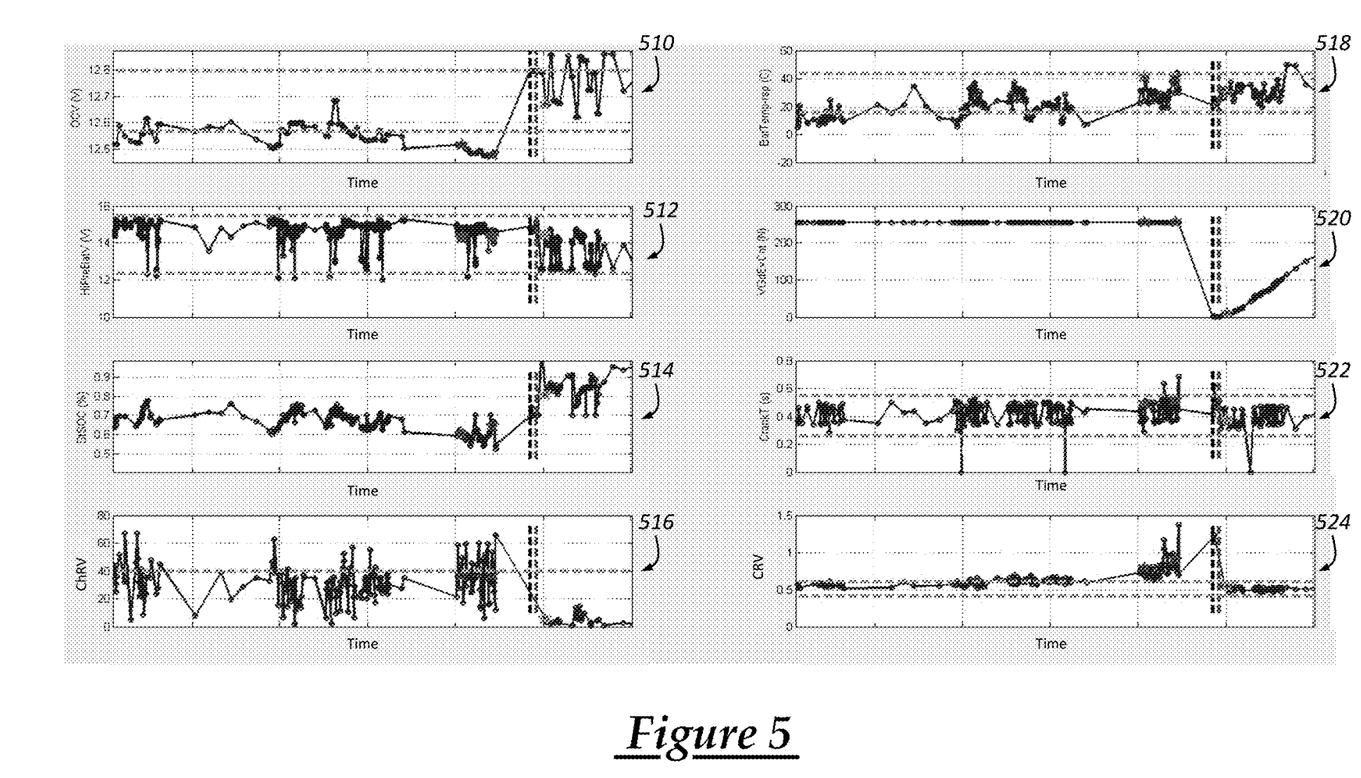

FIG. 5 illustrates example parameters indicative of a battery specific problem. The x-axis in this example represents a time period of about 120 days. As with FIG. 4, non-load related readings include OCV 510; the voltage across the battery terminals, or the high precision battery voltage (HiPreBatV) 512; the SOC 514; the battery resistance, or in this example the charging resistance value (ChRV) as provided in Equation 2 above, 516; and the battery temperature 518. Load related readings include cranking voltage, or in this example, a voltage event counter (VGdEvCnt) 520; crank time 522; and crank resistance, or in this example the crank resistance value (CRV) as provided in Equation 1 above, 524. It should be noted that the y-axis scales may vary slightly from those shown in FIG. 4, but to help visualize the variance in the parameters, example thresholds are designated with thick dashed horizontal lines. After the point on each graph designated by two thick dashed vertical lines, the vehicle battery has been replaced. Before the point on each graph designated by two thick dashed vertical lines, the load related readings and non-load related readings indicate a battery system problem as a whole, and more particularly, indicate a battery specific problem. For example, the crank time 522 and crank resistance 524 were higher than the designated thresholds in this example. The battery temperature 518 was in an acceptable range when these higher crank times and higher resistance values were observed. The cranking voltage 520 indicated an errant cranking event, as the voltage dropped below a threshold voltage during cranking. Further, at least some of the non-load related readings are indicative of a battery specific problem. For example, the OCV 510 was below threshold values, and the battery resistance 516 was consistently higher than the acceptable threshold. Accordingly, in this instance, a battery system problem would be diagnosed.

Figure 6:
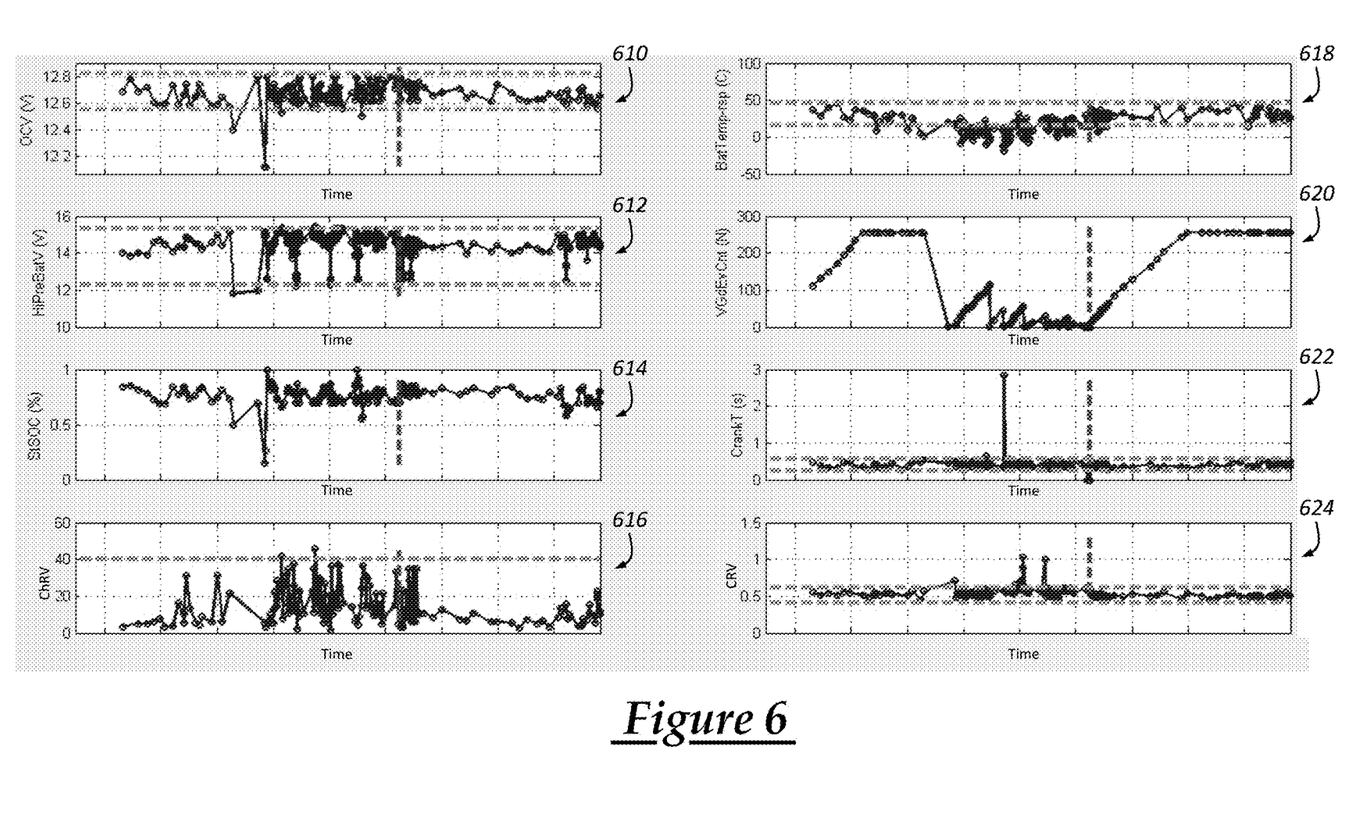

FIG. 6 illustrates example parameters indicative of a battery connection problem. The x-axis in this example represents a time period of about 400 days. As with FIGS. 4 and 5, non-load related readings include OCV 610; the voltage across the battery terminals, or the high precision battery voltage (HiPreBatV) 612; the SOC 614; the battery resistance, or in this example the charging resistance value (ChRV) as provided in Equation 2 above, 616; and the battery temperature 618. Load related readings include cranking voltage, or in this example, a voltage event counter (VGdEvCnt) 620; crank time 622; and crank resistance, or in this example the crank resistance value (CRV) as provided in Equation 1 above, 624. It should be noted that the y-axis scales may vary slightly from those shown in FIGS. 4 and 5, but to help visualize the variance in the readings or parameters, example thresholds are designated with thick dashed horizontal lines. After the point on each graph designated by a single thick dashed vertical line, the battery connection problem has been remedied. Before the point on each graph designated by the thick dashed vertical line, the load related readings and non-load related readings indicate a battery system problem as a whole, and more particularly, do not indicate a battery specific problem (e.g., the readings are indicative of a battery connection problem). For example, load related readings such as the cranking voltage 620 indicate a battery system problem. Further, with a voltage counter as provided in these examples, a battery connection problem may be more likely to impact the cranking voltage, as compared with a battery specific problem. The non-load related readings in this example do not indicate that there is a battery specific problem. For example the OCV 610, the voltage across the battery terminals 612, the SOC 614, and the battery resistance 615 all generally fall within the acceptable thresholds. Thus, the non-load related readings do not indicate a battery specific problem, while the load related readings indicate that there is a battery system problem, or more particularly, one or more errant cranking events. Accordingly, in this example, a battery connection problem would be diagnosed.

If it is determined in step 108 that there is a battery specific problem, then in step 110, a battery system problem is diagnosed. If there is not a battery specific problem, then in step 112, a battery connection problem is diagnosed. In one embodiment of steps 110 and 112, a warning may be displayed to the driver or vehicle user via a human machine interface (HMI), an electronic device such as a smart phone, computer, tablet, etc., or in any other operable fashion. If for example, a battery connection problem is diagnosed in step 112, the driver may be able to inspect and clean corroded battery terminals and possibly avoid any further maintenance to the battery system or vehicle.

It is to be understood that the foregoing description is not a definition of the invention, but is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. For example, the specific combination and order of steps is just one possibility, as the present method may include a combination of steps that has fewer, greater or different steps than that shown here. All such other embodiments, changes, and modifications are intended to come within the scope of the appended claims.

As used in this specification and claims, the terms "for example," "e.g.," "for instance," "such as," and "like," and the verbs "comprising," "having," "including," and their other verb forms, when used in conjunction with a listing of one or more components or other items, are each to be construed as open-ended, meaning that that the listing is not to be considered as excluding other, additional components or items. Other terms are to be construed using their broadest reasonable meaning unless they are used in a context that requires a different interpretation.

The invention claimed is:

1. A method for diagnosing a battery system problem in a vehicle, the method comprising the steps of:
   gathering one or more load related readings and one or more non-load related readings, wherein load related readings reflect performance of the battery system during a cranking event;
   using at least one load related reading, at least one non-load related reading, or a combination of one or more load related readings and non-load related readings to determine if there is a battery system problem;
   when it is determined that there is a battery system problem, then determining whether there is a battery specific problem; and
   when it is determined that there is a battery system problem and no battery specific problem, then alerting a user of the vehicle that there is a battery connection problem.

2. The method of claim 1, wherein the load related readings are representative of at least one of a cranking voltage of a battery during a cranking event, a crank resistance of the battery during a cranking event, or a crank time for a cranking event.

3. The method of claim 2, wherein the cranking voltage represents a voltage difference between a positive terminal and a negative terminal of the battery during a cranking event.

4. The method of claim 3, wherein the cranking voltage is provided via a voltage event counter that provides a count of successful cranking events, the successful cranking events being at least partially defined by a voltage difference between a positive terminal and a negative terminal of the battery during a cranking event that is above a voltage threshold.

5. The method of claim 1, wherein the non-load related readings are representative of at least one of an open circuit voltage (OCV) of the battery, a state of charge (SOC) of the battery, and an internal battery resistance.

6. The method of claim 1, wherein the step of determining if whether there is a battery system problem includes using at least one load related reading to determine whether there is a battery system problem and using at least one non-load related reading to determine whether there is a battery specific problem.

7. The method of claim 6, wherein the at least one non-load related reading is compared to a corresponding non-load reading threshold to determine whether there is a battery specific problem.

8. The method of claim 6, wherein the at least one load related reading includes crank resistance and the at least one non-load related reading includes at least one of an internal battery resistance of the battery, an open circuit voltage (OCV) of the battery, and a state of charge (SOC) of the battery.

9. The method of claim 1, further comprising the step of verifying that there is a battery connection problem before alerting the user of the battery connection problem.

10. The method of claim 9, wherein the step of verifying that there is a battery connection problem involves using a stable voltage reading and an oscillating current reading to verify the battery connection problem.

11. The method of claim 1, wherein the method is initiated following a cranking event.

12. A method for diagnosing a battery system problem in a vehicle, the method comprising the steps of:
gathering one or more load related readings and one or more non-load related readings using one or more battery sensors integrated within the battery system of the vehicle;
using at least one of the load related readings to determine whether an errant cranking event occurred; and
when it is determined that an errant cranking event occurred, then evaluating one or more load related readings, one or more non-load related readings, or a combination of one or more load related readings and non-load related readings gathered from the one or more battery sensors integrated with the battery system of the vehicle to determine when there is a battery connection problem and alerting a user of the vehicle of the battery connection problem.

13. The method of claim 12, wherein the load related readings include cranking voltage and crank resistance, and the cranking voltage and crank resistance are used to determine if an errant cranking event occurred, and if an errant cranking event has occurred, then evaluating one or more non-load related readings to determine whether there is a battery connection problem.

14. The method of claim 13, wherein the evaluating step includes comparing the one or more non-load related readings to corresponding non-load reading thresholds to determine whether there is a battery connection problem.

15. A battery system for a vehicle, comprising:
a battery;
one or more battery connections;
one or more battery sensors electrically connected to the battery via at least one of the battery connections; and
a control module configured to:
gather one or more load related readings that reflect performance of the battery system during a cranking event and one or more non-load related readings from the one or more battery sensors, use one or more load related readings to diagnose a battery system problem and a battery specific problem, and alert a user of the vehicle of a battery connection problem when there is a battery system problem diagnosis and not a battery specific problem diagnosis.

16. The battery system of claim 15, wherein the control module is further configured to gather one or more non-load related readings from the one or more battery sensors and use the load related readings, the one or more non-load related readings, or a combination of the load related readings and one or more non-load related readings to diagnose a battery specific problem.

17. The battery system of claim 15, wherein the battery is a lead acid, starting-lights-ignition (SLI) battery.

* * * * *